United States Patent
Verma et al.

(10) Patent No.: US 6,647,041 B1
(45) Date of Patent: Nov. 11, 2003

(54) ELECTRICALLY PUMPED VERTICAL OPTICAL CAVITY WITH IMPROVED ELECTRICAL PERFORMANCE

(75) Inventors: Ashish K. Verma, San Jose, CA (US); Arnold C. Chen, Fremont, CA (US); Daniel A. Francis, Oakland, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/580,322

(22) Filed: May 26, 2000

(51) Int. Cl.$^7$ ................................................. H01S 5/00
(52) U.S. Cl. ............................. 372/45; 372/43; 372/50
(58) Field of Search ............................. 372/45, 43, 50; 375/45, 50

(56) References Cited

U.S. PATENT DOCUMENTS

| | | | | | |
|---|---|---|---|---|---|
| 5,034,783 | A | * | 7/1991 | Chang et al. | 257/14 |
| 5,181,086 | A | * | 1/1993 | Yoshida | 257/14 |
| 5,404,027 | A | * | 4/1995 | Haase et al. | 257/13 |
| 5,538,918 | A | * | 7/1996 | Haase et al. | 438/29 |
| 5,617,446 | A | * | 4/1997 | Ishibashi et al. | 257/94 |
| 5,867,516 | A | * | 2/1999 | Corzine et al. | 372/45 |
| 5,991,321 | A | * | 11/1999 | Duggan | 372/45 |
| 6,399,970 | B2 | * | 6/2002 | Kubo et al. | 257/192 |

OTHER PUBLICATIONS

Adler, M.S., "Accurate Calculations of the Foward Drop and Power Dissipation in Thyristors," IEEE Transactions on Electron Devices, vol. ED–25, No. 1 (Jan. 1978), pp. 16–22.

Liou, J.J. et al., "Thermal–Avalanche Interacting Behaviour of AlGaAs/GaAs Multi–Emitter Finger Heterojunction Bipolar Transistors," Solid–State Electronics, vol. 38, No. 9 (1995), pp. 1645–1648.

Liu, W., "The Interdependence Between the Collapse Phenomenon and the Avalanche Breakdown in AlGaAs/GaAs Power Heterojunction Bipolar Transistors," IEEE Transactions on Electron Devices, vol. 42, No. 4 (Apr. 1995), pp. 591–597.

Piprek, J. et al.; "Abrupt self–switching in fused GaAs/InP vertical–cavity lasers," Technical Digest (summaries of papers presented at the Conference on Lasers and Electro–Optics, Post–conference edition, CLEO '99, Conference on Lasers and Electro–Optics (IEEE Cat. No. 99CH37013). Conference on Lasers and Electro–Optics, Baltimore, MD, USA, May 23–28, 1999; Washington, DC, USA: Opt. Soc. America, 1999, pp. 458–459.

Walker, J.D. et al., "A Gain–Clamped, Crosstalk Free, Vertical Cavity Lasing Semiconductor Optical Amplifier for WDM Applications," summaries of the papers presented at the topical meeting, Integrated Photonics Search; 1996 Technical Digest Series; Proceedings of Integrated Photonics; Boston, MA, USA, 29.04–02.05 1996, vol. 6, 1996, pp. 474–477.

* cited by examiner

*Primary Examiner*—Paul Ip
*Assistant Examiner*—Delma Flores Ruiz
(74) *Attorney, Agent, or Firm*—Workman Nydegger

(57) ABSTRACT

A monolithic semiconductor device extends primarily along a vertical direction and includes the following layers. A first semiconductor layer and a second semiconductor layer form an active region between them. A third semiconductor layer is doped the same type as the second semiconductor layer but is lattice mismatched to the second semiconductor layer. The lattice mismatch results in unwanted electrical effects. An additional doping layer, preferably a delta doping layer, is located in close proximity to the interface between the second and third semiconductor layers. The delta doping layer mitigates the unwanted electrical effects introduced by the lattice mismatch. In a preferred embodiment, the device further includes a bottom mirror layer and a top mirror layer, which together form a laser cavity including the active region.

39 Claims, 3 Drawing Sheets

ELECTRICALLY PUMPED VERTICAL OPTICAL CAVITY WITH IMPROVED ELECTRICAL PERFORMANCE

CROSS-REFERENCE TO RELATED APPLICATION

This application relates to U.S. patent application Ser. No. 09/273,813, "Tunable-Gain Lasing Semiconductor Optical Amplifier," by Jeffrey D. Walker, et al., filed Mar. 22, 1999; U.S. patent application Ser. No. 09/299,824, "Optical Signal Power Monitor And Regulator," by Sol P. Dijaili and Jeffrey D. Walker, filed Apr. 26, 1999; and U.S. patent application Ser. No. 09/09/416,817, "Low-Noise, High-Power Optical Amplifier," by Sol P. Dijaili and Jeffrey D. Walker, filed Oct. 12, 1999. The subject matter of all of the foregoing is incorporated herein by reference.

GOVERNMENT RIGHTS LEGEND

Work on this invention was performed under the support of the U.S. Department of Commerce, National Institute of Standards and Technology, Advanced Technology Program, Cooperative Agreement Number 70NANB8H4016. The United States Government has certain rights in this invention.

BACKGROUND OF THE INVENTION

1. Field of the Invention

This invention relates generally to improving the electrical performance of active semiconductor devices with defects. More particularly, it relates to improving the electrical performance of lattice-mismatched semiconductor devices used in optical cavities, such as vertical cavity surface emitting lasers and vertical lasing semiconductor optical amplifiers.

2. Description of the Related Art

As the result of continuous advances in technology, particularly in the area of networking such as the Internet, there is an increasing demand for communications bandwidth. For example, the transmission of data over a telephone company's trunk lines, the transmission of images or video over the Internet, the transfer of large amounts of data as might be required in transaction processing, or videoconferencing implemented over a public telephone network typically require the high speed transmission of large amounts of data. As applications such as these become more prevalent, the demand for communications bandwidth capacity will only increase.

Optical fiber is a transmission medium that is well-suited to meet this increasing demand. Optical fiber has an inherent bandwidth which is much greater than metal-based conductors, such as twisted pair or coaxial cable; and protocols such as the SONET protocol have been developed for the transmission of data over optical fibers. Typical communications system based on optical fibers include a transmitter, an optical fiber, and a receiver. The transmitter converts the data to be communicated into an optical form and then transmits the resulting optical signal via the optical fiber to the receiver. The receiver recovers the original data from the received optical signal. Optical amplifiers, which boost the power of the optical signal propagating through the system, are also a basic building block for fiber communications systems.

Many technologies exist for building the various components within fiber communications systems. For example, optical amplifiers may be created by doping a length of fiber with rare-earth metals, such as erbium, in order to form an active gain medium. The doped fiber is pumped to create a population inversion in the active medium. Then, when an optical signal propagates through the doped fiber, it is amplified due to stimulated emission. Transmitters may be a laser source modulated externally by a lithium niobate modulator, or a directly modulated DFB laser or FP laser. Semiconductor technologies are another alternative for building components. For example, laser sources may be created by using semiconductor fabrication techniques to build an optical cavity and a semiconductor active region within the optical cavity. The active region acts as the gain medium for the cavity. Pumping the active region results in a lasing optical cavity. In a variation of this theme, semiconductor devices may also be used as amplifiers. In one approach, an electrical current pumps the semiconductor active region of the amplifier, resulting in an increased carrier population. The optical signal then experiences gain as it propagates through the active region due to stimulated emission.

These types of semiconductor devices often will function in both the optical and electrical domains. For example, the amplifier described above functions as an optical device since an optical signal injected into the device is amplified as it propagates through the device. However, it also functions as an electrical device since the basic gain mechanism is an electrical effect (e.g., a p-n junction or multiple quantum well) and the device may also be electrically pumped. As a result, finding materials which can meet all of the optical and electrical requirements is difficult and, more often than not, more than one materials system is used to create the required device. For example, it is common to create devices which combine GaAs-based Bragg mirrors with InP-based active regions. However, the use of multiple materials systems creates its own problems, not the least of which is how to effectively combine the different materials systems. For example, GaAs and InP are not lattice matched and devices which combine the two typically will have a lattice mismatched interface somewhere, which can create undesirable effects. In addition, the techniques used to fabricate these devices may also lead to undesirable effects, such as the creation of deep-level defects, particularly if the device requires unusual or non-standard fabrication processes.

Thus, there is a need for semiconductor devices which overcome the undesirable effects generated by combining different material systems and/or by the processes used to fabricate the devices.

SUMMARY OF THE INVENTION

In accordance with the present invention, a monolithic semiconductor device extends primarily along a vertical direction and includes the following layers. A first semiconductor layer is doped either n-type or p-type, but preferably is n-type. A second semiconductor layer is doped with the other doping type (i.e., p-type if the first layer is n-type and vice versa). An active region is formed between the first and second semiconductor layers. A third semiconductor layer is doped the same type as the second semiconductor layer. The second and third semiconductor layers are in direct contact with each other but are lattice mismatched. In an alternate embodiment, the interface between the two layers is characterized by trap-like defects rather than being lattice mismatched. An additional doping layer, preferably a delta doping layer, is located in close proximity to the interface between the second and third semiconductor layers. The dopant concentration in the doping layer is heavier than in the bulk of either the second semiconductor layer or the third semiconductor layer. In an alternate embodiment, the second semiconductor layer includes two sublayers with a contaminated interface between them. Thus, one of the sublayers acts as a spacer to separate the contaminated interface from the lattice mismatched (or heavily defective) interface.

In a preferred embodiment, the device further includes a bottom mirror layer and a top mirror layer, which together form a laser cavity which includes the active region. In one embodiment, the laser cavity is designed to output laser light in a vertical direction, for example as a vertical cavity surface emitting laser (VCSEL). In another embodiment, the device includes a pump input to the active region. The active region also includes an amplifying path which is not colinear with the optical path of the laser cavity. When the active region is pumped above a lasing threshold for the laser cavity, the gain of the active region is clamped to a gain value which essentially is constant. Thus, an optical signal propagating along the amplifying path is amplified by an essentially constant gain.

The present invention is particularly advantageous for a number of reasons. The doping and spacer layers both lead to improved electrical performance. For example, in the context of the VCSELs and VLSOAs, they result in lower turn-on voltages for the laser cavities, thus resulting in lower power consumption and lower heat generation. They also mitigate nonlinear thyristor-type effects caused by the lattice-mismatched interface and/or deep-level defects.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1A:
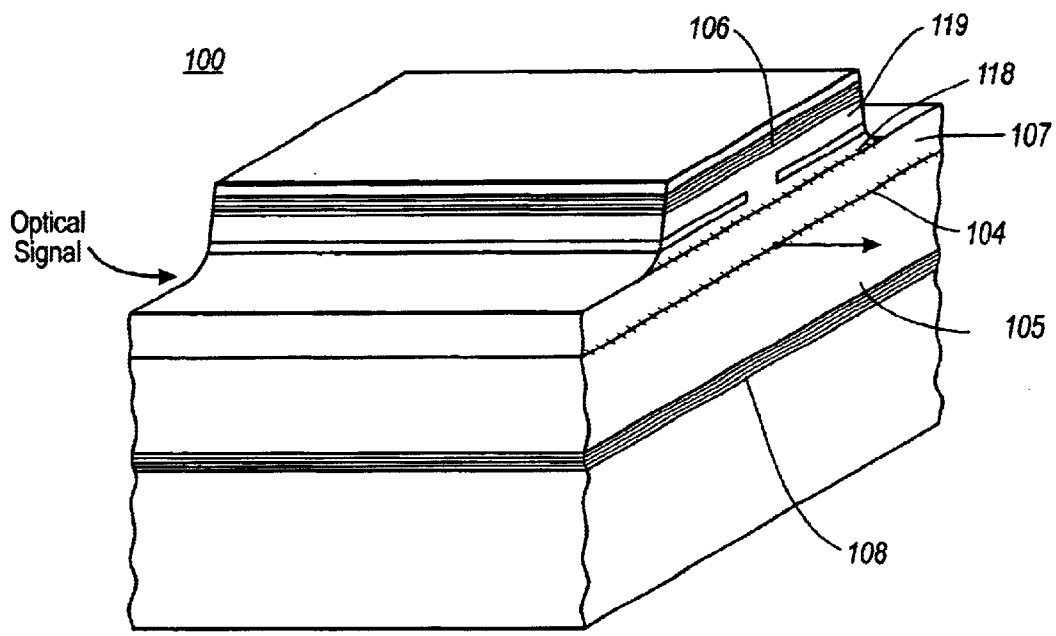
FIG. 1A is a perspective view of a preferred embodiment of a vertically lasing semiconductor optical amplifier (VLSOA) 100 according to the present invention.
Figure 1B:
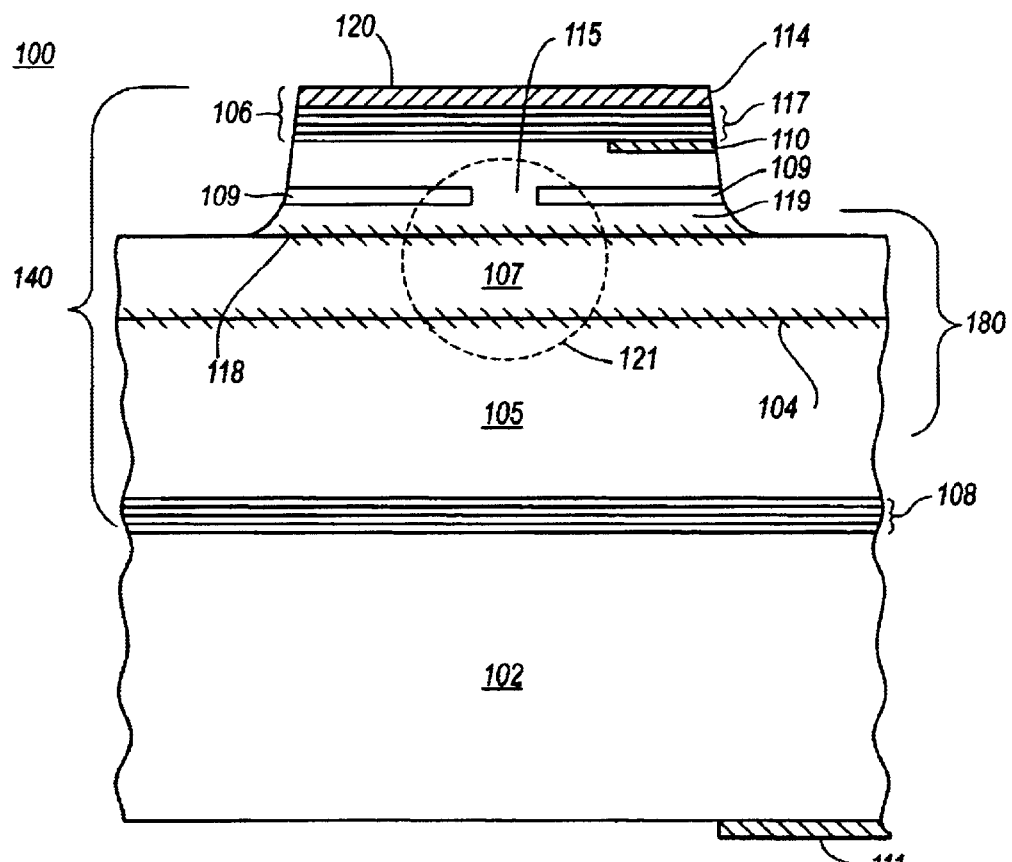
FIG. 1B is a transverse cross-sectional view of VLSOA 100.
Figure 1C:
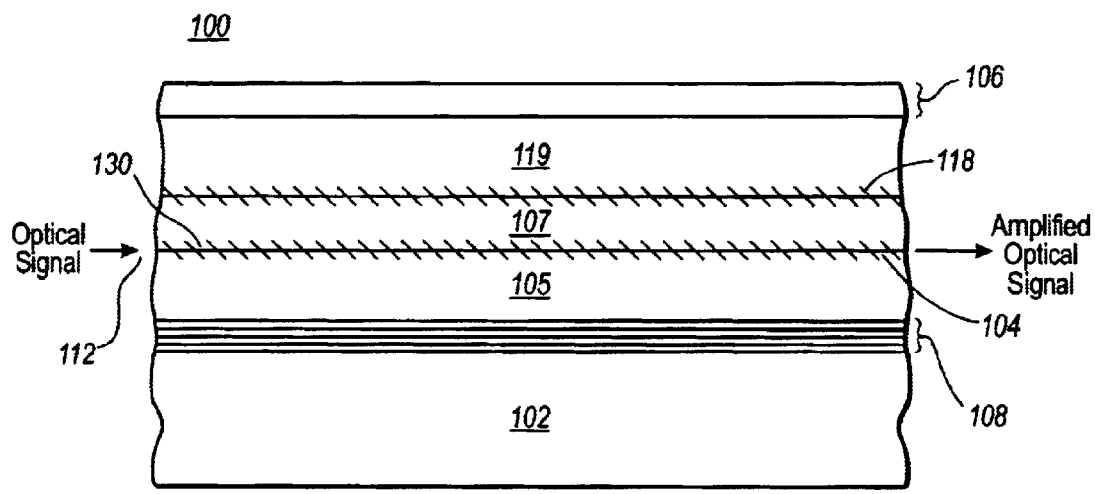
FIG. 1C is a longitudinal cross-sectional view of VLSOA 100.

FIGS. 1A–1C are a perspective view, transverse cross-section, and longitudinal cross-section, respectively, of a preferred embodiment of a vertical lasing semiconductor optical amplifier (VLSOA) 100 according to the present invention, with FIG. 1 B showing the most detail. VLSOA 100 includes a semiconductor device 180 including an active region 104. The VLSOA 100 also has an optical input 112 and an optical output 114 (which are simply boundaries of device 180 in this embodiment), with an amplifying path 130 coupled between the input 112 and the output 114 and traversing the active region 104. Each VLSOA 100 further includes a laser cavity 140 including the active region 104, and a pump input coupled to the active region 104. The pump input is for receiving a pump to pump the active region 104 above a lasing threshold for the laser cavity 140. This particular embodiment is electrically pumped and the pump input includes the electrical contacts 110,111, through which a pump current is injected.

VLSOA 100 generally operates as follows. The VLSOA 100 receives an optical signal at input 112. The optical signal propagates through VLSOA 100 along the amplifying path 130. The VLSOA 100 also receives a pump at the pump input 110,111, which pumps the active region 104 above a lasing threshold for the laser cavity 140. When lasing occurs, the round-trip gain offsets the round-trip losses for the laser cavity 140. In other words, the gain of the active region 104 is clamped to the gain value necessary to offset the round-trip losses. The optical signal is amplified according to this gain value as it propagates along the amplifying path 130 (i.e., through the active region 104). The final, amplified optical signal exits VLSOA 100 via output 114.

Note that the gain experienced by the optical signal as it propagates through VLSOA 100 is determined in part by the gain value of the active region 104 (it is also determined, for example, by the length of the amplifying path 130) and this gain value, in turn, is determined primarily by the lasing threshold for the laser cavity 140. In particular, the gain experienced by the optical signal as it propagates through VLSOA 100 is substantially independent of the amplitude of the optical signal. This is in direct contrast to the situation with non-lasing SOAs and overcomes the distortion and crosstalk disadvantages typical of non-lasing SOAs.

Turning again to FIGS. 1A–1C, the preferred embodiment shown is a vertical lasing semiconductor optical amplifier, meaning that the laser cavity 140 is oriented vertically with respect to the amplifying path 130. The VLSOA 100 is long in the longitudinal direction, allowing for a long amplifying path 130 and, therefore, more amplification. The entire VLSOA 100 is an integral structure formed on a single substrate 102 and may be integrated with other devices, for example waveguides leading to and from the amplifying path 130 within VLSOA 100. In this case, the optical input 112 and output 114 may not exist as a distinct structure or facet but may simply be the boundary between the waveguide and VLSOA 100. Furthermore, although this disclosure discusses the VLSOA 100 as a single device, the teachings herein apply equally to arrays of devices. The semiconductor device 180 and the remainder of VLSOA 100 extend primarily in the vertical direction, allowing the VLSOA 100 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

Referring to FIG. 1B and working from bottom to top in the vertical direction (i.e., working away from the substrate 102), VLSOA 100 includes a bottom mirror 108, bottom cladding layer 105, active region 104, top cladding layer 107, confinement layer 119, and a top mirror 106. The bottom cladding layer 105, active region 104, top cladding layer 107, and confinement layer 119 are in electrical contact with each other and may be in direct physical contact as well. A delta doping layer 118 is located between the top cladding layer 107 and confinement layer 119. The confinement layer 119 includes a confinement structure 109, which forms aperture 115. The VLSOA 100 also include an electrical contact 110 located above the confinement structure 109, and a second electrical contact 111 formed on the bottom side of substrate 102.

The semiconductor device 180 is formed by the layers 105, 104, 107, and 119, which are layers of semiconductor materials. In this preferred embodiment, the substrate 102 is InP, the bottom cladding layer 105 is n-doped InP (n-InP), the top cladding layer 107 is p-InP, and the confinement layer 119 is p-GaAs/AlGaAs. The switch from p-InP in top cladding layer 107 to p-GaAs in confinement layer 119 facilitates the construction of features such as the confinement structure 109 and top mirror 106. p-GaAs, however, is not lattice-matched to p-InP, resulting in unwanted electrical effects. The delta doping layer 118, which in this embodiment is a p-type Beryllium (Be) doping, counteracts these unwanted electrical effects, as will be described in greater detail below. The doping concentration in the delta doping layer 118 is higher than that of the surrounding layers 107,119. Other dopants, including III–V dopants such as carbon and zinc would also be suitable.

In more detail, in a preferred embodiment, the top cladding layer 107 is InP doped with zinc to a three-dimensional concentration of $1 \times 10^{18}$ cm$^{-3}$. Layer 107 is fabricated using OMCVD. The delta doping layer 118 is formed by depositing Be via MBE to a two-dimensional concentration of $4 \times 10^{13}$ cm$^{-2}$. The thickness of the resulting delta doping layer 118 is on the order of several monolayers. Confinement layer 119 is GaAs doped with Be to a three-dimensional concentration of $1 \times 10^{18}$ cm$^{-3}$ and is also formed using MBE. This particular structure is an example. Other materials, dopants, dopant concentrations, fabrication methods, etc. would be suitable depending on the intended device 180. For example, the concentration of dopant in the delta doping layer 118 is selected to counteract unwanted electrical effects, such as those due to trap-like defects caused by the lattice mismatch at interface 107–119 and/or the fabrication processing of device 180. In this particular example, concentrations as low as $8 \times 10^{12}$ cm$^{-2}$ have been sufficient to counteract the concentration of undesirable trap-like defects, although other concentrations will be appropriate for other devices 180. As another example, the bulk dopant concentration in layers 107 and 119 are also exemplary and will vary from one device 180 to the next.

The laser cavity 140 is formed primarily by the two mirrors 106 and 108 and the active region 104. This embodiment is electrically pumped so the pump input includes the electrical contacts 110,111. The optical signal amplified by the VLSOA 100 is confined in the vertical direction by index differences between bottom cladding 105, active region 104, and top cladding 107; and is confined in the transverse direction by index differences between the confinement structure 109 and the resulting aperture 115. As a result, the optical signal to be amplified is generally concentrated in dashed region 121, and the amplifying path 130 is through the active region 104 in the direction in/out of the plane of the paper with respect to FIG. 1B.

The active region 104 in embodiment 100 includes a double heterostructure of p-InAlAs/I-InAlGaAs/n-InAlAs. In other embodiments, the active region 104 may comprise a multiple quantum well (MQW) active region. MQW structures include several quantum wells and quantum wells have the advantage of enabling the formation of lasers with relatively low threshold currents. Quantum wells may be fabricated using various materials systems, including for example InAlGaAs on InP substrates, InGaAsP on InP, GaInNAs on GaAs, InGaAs on ternary substrates, and GaAsSb on GaAs. A preferred embodiment uses InAlGaAs grown on an InP substrate. GaAs, InGaAs, or InAlGaAs on GaAs; or nitride material systems may also be suitable. Alternatively, the active region 104 may comprise a single quantum well or a double-heterostructure active region. The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The 1.28–1.35 micron region is currently also preferred for data communications over single mode fiber, with the approximately 0.8–1.1 micron region being an alternate wavelength region.

In preferred embodiment 100, mirror 108 is a Bragg reflector formed by either alternating layers of InAlGaAs and InAlAs, alternating layers of InGaAsP and InP, or alternating layers of GaAs and AlGaAs. Mirror 106 is a hybrid mirror, which combines a number of layers of a Bragg reflector 112 (specifically, alternating layers of GaAs and AlGaAs, and /or alternating layers of Si and SiO$_2$) followed by a metallic mirror 114 (specifically, gold). The mirrors 106 and 108 may comprise other types of Bragg reflectors or other types of non-Bragg mirrors. They typically will have reflectivies in the range of approximately 95–100%. Bragg reflectors are formed by periodic variations of the index of refraction of a medium and can be highly reflective. For example, the Bragg reflector may comprise alternating layers of thicknesses $d_1$ and $d_2$ and refractive indices $n_1$ and $n_2$ such that $n_1 d_1 + n_2 d_2 = \lambda/2$, where $\lambda$ is the wavelength to be reflected. The reflectivity $R = \{[1-(n_1/n_2)^{2N}]/(1+(n_1/n_2)^{2N}]\}^2$, where N is the number of periods (pairs) in the Bragg reflector. Reflectivities as high as 99% or more may be achieved. In addition to the ones described above, Bragg reflectors may be fabricated using various materials systems, such as, for example, alternating layers of GaAs and AlAs, or alternating layers of SiO$_2$ and TiO$_2$.

The electrical contacts 110,111 are metals that form an ohmic contact with the semiconductor material. Commonly used metals include titanium, platinum, nickel, germanium, gold, and aluminum. In this embodiment, the laser cavity is electrically pumped by injecting a pump current via the electrical contacts 110,111 into the active region 104. In particular, contact 110 is a p-type contact to inject holes into active region 104, and contact 111 is an n-type contact to inject electrons into active region 104. Contact 110 is located above the semiconductor structure (119 or the semiconductor part of 117, if any) and below the dielectric part of 117 (if any). VLSOA 100 preferably has a number of isolated electrical contacts 110 to allow for independent pumping within the device. This is advantageous because in this embodiment, VLSOA 100 is long in the longitudinal direction and independent pumping allows, for example, different voltages to be maintained at different points along the VLSOA. Alternately, the contacts 110 may be doped to have a finite resistance or may be separated by finite resistances, rather than electrically isolated.

Confinement structure 109 is formed by wet oxidizing the confinement layer 119, which consists of GaAs and AlGaAs. The resulting confinement structure 109 is aluminum oxide and the aperture 115 is the unaltered AlGaAs. The confinement structure 109 has a lower index of refraction than aperture 115. Hence, the effective cross-sectional size of laser cavity 140 is determined in part by aperture 115. In other words, the confinement structure 109 provides lateral confinement of the optical mode of laser cavity 140. In this embodiment, the confinement structure 109 also has a lower conductivity than aperture 115. Thus, pump current injected through electrical contact 110 will be channeled through aperture 115, increasing the spatial overlap with optical signal 121. In other words, the confinement structure 109 also provides confinement of the pump current.

VLSOA 100 operates as follows. Pump current is injected through contacts 110,111, or, more precisely, holes are injected through contact 110 and electrons through contact 111. These holes and electrons flow to the active region 104, where they increase the carrier density in the active region 104. That is, the pump current is used to pump the active region 104. The pump current is laterally confined by confinement structure 109. The pump current is sufficiently high to exceed a lasing threshold for vertical cavity 140. As a result, laser radiation is generated by the vertical cavity 140. This laser radiation may be emitted from the vertical cavity, for example, through the top surface 120 or into the substrate 102 or it may be generated but not actually emitted from the VLSOA 100. The laser radiation may lie in the visible light range, infrared range, ultraviolet range, or any other frequency range.

While the laser cavity 140 is operating above the lasing threshold, an optical signal propagates along the amplifying path 130. As the optical signal propagates through the active region 104, the optical signal is amplified by a gain multiplier due to stimulated emission of additional photons. The gain multiplier is substantially constant (i.e., independent of the amplitude of the optical signal) because the laser radiation produced by laser cavity 140 acts as a ballast to prevent gain saturation. That is, when the optical signal is weaker fewer additional photons are stimulated by the optical signal, but more laser radiation is generated. But when the optical signal is stronger, more additional photons are stimulated by the optical signal, but less laser radiation is generated. Typically, the value of the constant gain multiplier is inversely proportional to the loss of the cavity mirrors 106 and 108. For example, if a 0.2% loss (99.8% reflectivity) results in a gain of 10 dB (10 times), then a three times larger 0.6% loss (99.4% reflectivity) would result in a three times larger logarithmic gain of 30 dB (1000 times) for otherwise identical VLSOAs 100.

Figure 2:
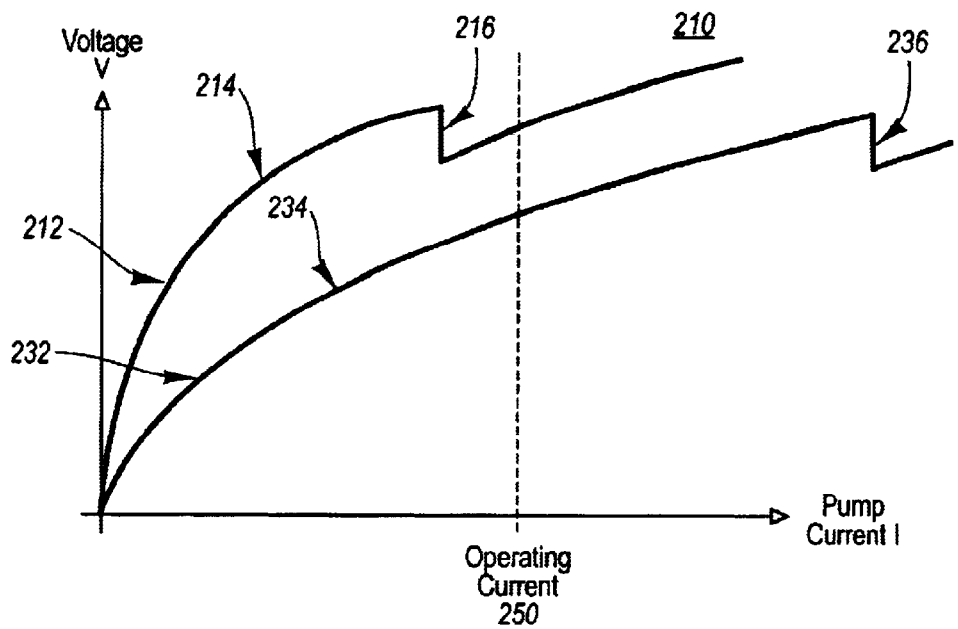
FIG. 2 is a graph of voltage as a function of pump current, illustrating operation of VLSOA 100.

Efficient operation of VLSOA 100 depends, in part, on efficient pumping of the laser cavity 140 by the pump current. FIG. 2 is a graph of voltage V as a function of pump current I, illustrating operation of VLSOA 100. Curve 210 shows the electrical behavior of VLSOA 100 without delta doping layer 118 whereas curve 230 shows the electrical characteristic with delta doping layer 118. Both curves are characterized by a turn-on voltage 212,232, which roughly marks turn-on of the active region 104. The turn-on point 212,232 is followed by a roughly linear region 214,234, with the slope of this region roughly representing the series resistance of the device. In curve 210, the linear region 214 is followed by a "kink" 216, at which point the voltage drops dramatically before resuming its upward trend. Curve 230 may also exhibit a kink 236, but at a much larger value of I.

Curve 230 is preferable to curve 210 for the following reasons. First, the turn-on voltage 232 is significantly lower than turn-on voltage 212 and series resistance 234 is typically lower than series resistance 214. This results in lower power consumption and lower heat generation for the VLSOA with delta-doping. Second, the early onset of kink 216 leads to significant degradation in performance of the laser cavity 140. For example, the value of pump current 250 typically is determined by other factors. At the value shown in FIG. 2, the undoped VLSOA of curve 210 experiences the kink 216 and its unwanted effects whereas the delta-doped VLSOA of curve 230 avoids the unwanted electrical phenomenon. As a result, the electrical performance of the delta-doped VLSOA of curve 230 is further improved relative to the undoped VLSOA of curve 210.

This electrical behavior is consistent with the following physical state of affairs. From top to bottom, the three semiconductor layers 119-107-105 are doped p-p-n and, therefore, the overall semiconductor device 180 ideally would behave as a p-n device. The first p-p interface should be of little or no electrical consequence since both layers 119-107 are doped p-type, even though they are constructed of different materials. However, the two layers 119-107 are lattice mismatched and, in the case of two p-type mismatched layers, this mismatch has been known to create deep level n-type interface defects (i.e., deep-level donors). Because of these trap-like defects, the interface 119-107 essentially behaves like an n-type material. Hence, the overall structure behaves like a p-n-p-n device, commonly known as a thyristor. This causes the turn-on voltage 212 to increase. It also leads to the kink 216, which is caused by an avalanche breakdown of the central n-p junction. The avalanche effect increases the concentration of injected holes and electrons into the central n-p junction. This injection exceeds the current flowing through the junction, which leads to carriers piling up at the junction. Eventually, the minority carrier concentration exceeds the equilibrium concentrations, at which point the bias condition of the n-p junction changes.

The delta doping layer 118 alleviates these problems by providing additional holes which combine with the deep-level donors, thus reducing their effect. The p-type delta doping provides an excess of holes in the vicinity of the deep level donors. Some of the free holes are trapped by the deep donors (i.e., they compensate the donor charge). The remainder of the free holes are able to promote current injection across the interface. Hence, the mismatched junction behaves as a p-p junction, as originally intended.

In delta doping layer 118, the dopants are concentrated in a narrow vertical region, in this case located in close proximity to the lattice mismatched interface 107-119. In a preferred embodiment, the delta doping layer 118 lies entirely within the top cladding layer 107. For example, the top cladding layer 107 may be delta doped and then the confinement layer 119 applied to the top cladding layer 107. In other embodiments, the delta doping layer 118 may lie entirely within confinement layer 119, or lie partially within layer 107 and partially within layer 119. Doping distributions other than delta doping may also be used. For example, a wide swath around interface 107-119 may be doped rather than the narrow delta doping layer 118.

However, a delta doping layer 118 is preferred for several reasons. First, since the traplike defects are presumably caused by the lattice mismatch of layers 107,119, they likely are concentrated in the vicinity of the interface between these two layers. Hence, a delta doping layer 118 in the same location will be matched to the expected distribution of defects. Second, in VLSOA 100, the delta doping layer 118 is located within the laser cavity 140. When the VLSOA 100 is operating, optical modes will be created within the laser cavity 140. Indiscriminately doping the interface 107-119, for example by using a broadly dispersed bulk doping rather than a delta doping, increases the chances that excess free carriers will interact with the optical modes within laser cavity 140. In fact, in a preferred embodiment, the delta doping layer 118, and hence also interface 107-119, will be located at a standing wave null of the optical cavity 140 in order to minimize the interaction of any additional dopants and the optical modes within the laser cavity 140.

Figure 3:
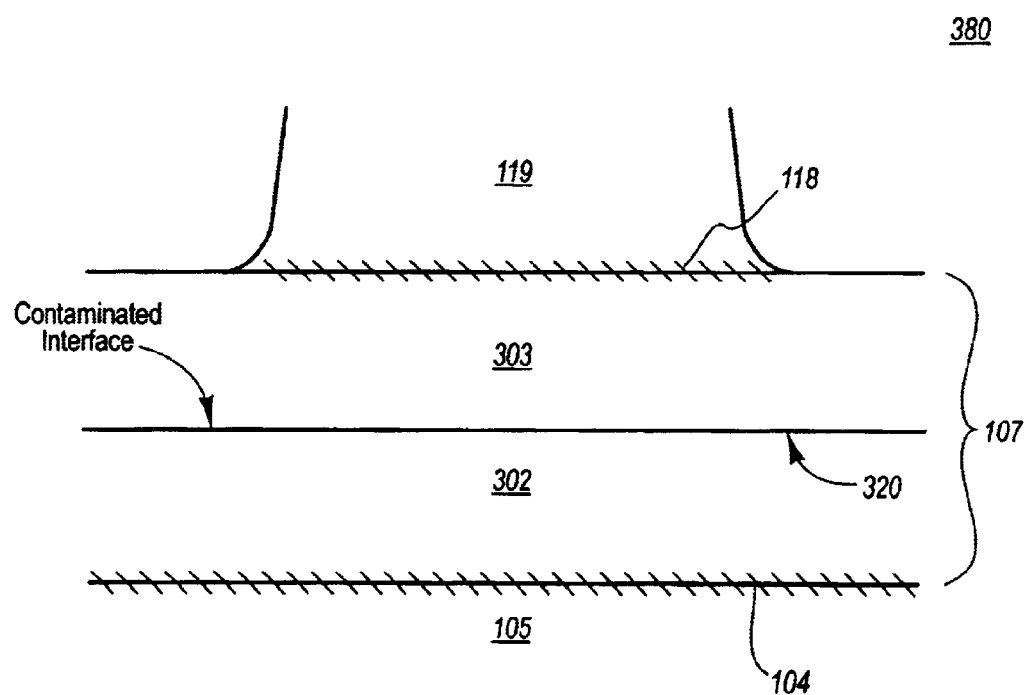
FIG. 3 is a transverse cross-sectional view of another embodiment of semiconductor device 180.

FIG. 3 is a cross-sectional view of another embodiment 380 of semiconductor device 180. Embodiment 380 includes the same three layers as device 180: bottom cladding layer 105, top cladding layer 107 and confinement layer 119. However, in this embodiment, the top cladding layer 107 includes two layers: a spacer sublayer 303 and a top cladding sublayer 302. The two layers 303,302 are referred to as "sublayers" rather than "layers" solely for convenience. The top cladding sublayer 302 is p-InP (as was the bulk of the top cladding layer 107 of device 180) and the spacer sublayer 303 is p-InAlGaAs, which is lattice matched to InP. In an alternate embodiment, the spacer sublayer 303 is simply more p-InP. The delta doping layer 118 is still located between the top cladding layer 107 (or, more specifically, the spacer sublayer 303) and the confinement layer 119.

The introduction of spacer sublayer 303 further improves the electrical performance of device 380 for the following reasons. Due to fabrication limitations, the top surface 320 of top cladding sublayer 302 may be contaminated. For example, fabrication may begin with a substrate manufacturer which produces a substrate 102, including bottom cladding layer 105 and top cladding sublayer 302. This is feasible since in this example these layers are all based on the InP materials system. The manufacturer would then ship this substrate to another party, which would add the lattice-mismatched GaAs layer 119. For example, wafer bonding and metamorphic regrowth are two common techniques appropriate for adding the lattice-mismatched layer 119. However, during this process, the top surface 320 may be exposed to contaminants and/or oxidized. Placing the lattice-mismatched layer 119 directly on top cladding sublayer 302 would result in an interface which is both lattice-mismatched and contaminated.

Spacer sublayer 303 is added to separate these two effects. In this embodiment, the p-InAlGaAs spacer layer 303 is grown on top of the p-InP sublayer 302. The interface between these two layers may be contaminated but it is not lattice mismatched since both layers 303,302 are from the same InP materials system and, therefore, lattice-matched to each other. The lattice-mismatched interface now occurs at the interface between the spacer layer 303 and the GaAs layer 119. In this way, the two potentially harmful effects are physically separated from each other. Furthermore, as was the case with the lattice-mismatched interface, the contaminated interface 302–303 preferably is located at a standing wave null of the laser cavity 140. In another embodiment, a delta doping layer (or other doping layer) is applied to the contaminated interface 302–303 in addition to the lattice-mismatched interface 303–119.

The addition of the spacer layer 303 also reduces the unwanted thyristor effects. As described previously, the lattice-mismatched interface 119–303 results in electrical behavior consistent with that of a p-n-p-n thyristor. A thyristor may be modeled as an intertwined p-n-p and n-p-n transistor. In this model, the kink 316 is caused by the cumulative current gains of the two transistors exceeding a value of one. Adding spacer layer 303 increases the width of the top cladding layer 107, which is the base of the n-p-n transistor within the thyristor. This, in turn, reduces the current gain of the n-p-n transistor, thus counteracting the unwanted effect.

In a preferred embodiment, the top cladding sublayer 302 is InP doped with zinc to a three-dimensional concentration of $1\times10^{18}$ cm$^{-3}$, fabricated using OMCVD. The spacing sublayer 303 is fabricated using MBE and the contaminated interface is caused by the switch from OMCVD to MBE techniques. The sublayer 303 is InAlGaAs formed as 78% In$_{0.53}$Ga$_{0.47}$As and 22% In$_{0.52}$Al$_{0.48}$As. The composition of the two ternary compounds are selected so that each is lattice matched to the InP of the top cladding sublayer 302. The 78%–22% composition of the final quaternary compound is selected for its optical characteristics. The sublayer 303 is doped with Be to a three-dimensional concentration of $1\times10^{18}$ cm$^{-3}$. For optical reasons, the spacing sublayer 303 is grown to a thickness of 2240 angstroms, which is an optical path length of a half a wavelength at the operating wavelength. However, for the purposes described above, thicknesses of 500–1000 angstroms are sufficient. In an alternate preferred embodiment, spacing sublayer 303 is InP, exactly matched to top cladding sublayer 302. The delta doping layer 118 is formed by depositing Be via MBE to a two-dimensional concentration of $4\times10^{13}$ cm$^{-2}$. Confinement layer 119 is GaAs doped with Be to a three-dimensional concentration of $1\times10^{18}$ cm$^{-3}$ and is also formed using MBE. This particular structure is an example. For example, the composition and thickness of spacing sublayer 303 were selected partly due to optical considerations. For devices 380 without optical considerations (e.g., transistors), other choices may be preferred. Other variations will be apparent.

Finally, although the above discussion focuses on a p-GaAs:p-InP:n-InP semiconductor device 180 used in the context of a VLSOA 100, other embodiments will be apparent. For example, the invention is not limited to p-p-n devices. The principles illustrated above are equally applicable to n-n-p devices in which the n-n interface is rendered p-type due to some defect. Furthermore, the defect need not be caused specifically by a lattice mismatch. Many types of trap-like defects, as may be caused by various growth dynamics or impurities, are also addressable using the techniques described above.

As another example, the invention is not limited to the VLSOA application described above. The semiconductor device 180 described above may be used in many other diverse applications. For example, many of the principles described in the context of VLSOA 100 are equally applicable to vertical cavity surface-emitting lasers (VCSELs). In a VCSEL, the laser cavity generates laser radiation which is the primary output of the device. In a VLSOA, the laser cavity generates laser radiation, which is used as a ballast for amplifying a separate optical signal propagating through the device. In other words, a VCSEL is similar to VLSOA 100 except that there is no signal to be amplified and, therefore, no need for an optical input 112, optical output 114, or amplifying path 130. Instead, the primary output is the optical radiation generated by laser cavity 140, which typically would be emitted through the top surface 120 or through the substrate 102. The design of the optical cavity 140 would be optimized accordingly. For example, a top view of a VCSEL may be more square rather than long and skinny as is the case with VLSOA 100. However, the principles illustrated above for increasing the electrical performance of the current pump would apply equally to the VCSEL. In fact, the cross-sectional VLSOA designs described in the context of FIGS. 1B and 3, including the specific examples given, are also suitable as VCSEL designs.

As a final example, the semiconductor active region is a basic device which has many applications outside of semiconductor lasers and semiconductor optical amplifiers. Semiconductor device 180 is nearly as basic in design and, therefore, equally general in application. The basic principles illustrated with respect to device 180 may be applied to other applications, including for example purely electrical designs of p-n junctions and transistors. In these applications, the principles illustrated may also be applied to materials systems other than the ones listed above. For example, devices based on semiconductor compounds (as opposed to single element crystals) are generally more likely to exhibit lattice mismatch effects or trap-like defects. Common materials systems include the Ill-V and II–VI compounds, as well as devices which combine semiconductor compounds with silicon (e.g., GaAs on Si).

Therefore, the scope of the appended claims should not be limited to the description of the preferred embodiments contained herein.

What is claimed is:

1. A monolithic optoelectronic semiconductor device extending along a vertical direction comprising:
    a first semiconductor layer of a first doping type, wherein the first doping type is either n-type doping or p-type doping;
    a second semiconductor layer of a second doping type, wherein the second doping type is either n-type doping or p-type doping, and the second doping type is different from the first doping type;
    an active region located between the first and second semiconductor layers;
    a third semiconductor layer of the second doping type, wherein the second and third semiconductor layers are lattice mismatched and are in direct contact with each other forming interface between the second and third semiconductor layers
    a concentration of dopants of the second doping type located in close proximity to the interface between the second and third semiconductor layers, wherein the concentration of dopants of the second doping type is in addition to bulk dopant concentrations in either the second semiconductor layer or the third semiconductor layer.

2. The device of claim 1 wherein the concentration of dopants comprises:
    a delta doping layer of the second doping type located in close proximity to the interface.

3. The device of claim 1 wherein the second semiconductor layer comprises:
    two sublayers with a contaminated interface therebetween.

4. The device of claim 1 wherein:
    the first and second semiconductor layers comprise materials selected from a first materials system; and
    the third semiconductor layer comprises materials selected from a second materials system, the first and second materials systems being lattice mismatched.

5. The device of claim 4 wherein at least one of the first and second materials systems is based on a semiconductor compound.

6. The device of claim 1 further comprising:
    a bottom mirror layer and a top mirror layer, wherein the bottom and top mirror layers form a laser cavity including the active region.

7. The device of claim 6 wherein the concentration of dopants comprises:
    a delta doping layer of the second doping type located in close proximity to the interface.

8. The device of claim 7 wherein the delta doping layer lies entirely within the second semiconductor layer.

9. The device of claim 7 wherein the delta doping layer lies entirely within the third semiconductor layer.

10. The device of claim 7 wherein the delta doping layer lies at the interface between the second semiconductor layer and the third semiconductor layer.

11. The device of claim 7 wherein the delta doping layer is located at a standing wave null of the laser cavity.

12. The device of claim 6 wherein the second semiconductor layer comprises:
    two sublayers with a contaminated interface therebetween.

13. The device of claim 12 wherein the second semiconductor layer further comprises:
    a second delta doping layer of the second dopant type located in close proximity to the contaminated interface.

14. The device of claim 12 wherein the contaminated interface is a result of a native oxide on one of the sublayers.

15. The device of claim 12 wherein the third semiconductor layer is wafer bonded to the second semiconductor layer.

16. The device of claim 12 wherein the third semiconductor layer is metamorphically grown on the second semiconductor layer.

17. The device of claim 12 wherein the contaminated interface is located at a standing wave null of the laser cavity.

18. The device of claim 6 wherein the first doping type is n-type doping.

19. The device of claim 6 wherein:
    the first and second semiconductor layers comprise materials selected from a first materials system; and
    the third semiconductor layer comprises materials selected from a second materials system, the first and second materials systems being lattice mismatched.

20. The device of claim 19 wherein at least one of the materials systems is based on a semiconductor compound.

21. The device of claim 20 wherein at least one of the materials systems is based on a III–V semiconductor compound.

22. The device of claim 20 wherein:
    the first materials system is based on InP compounds; and
    the second materials system is based on GaAs compounds.

23. The device of claim 20 wherein at least one of the materials systems is based on a II–VI semiconductor compound.

24. The device of claim 20 wherein at least one of the materials systems is based on silicon.

25. The device of claim 6 wherein the laser cavity is for outputting laser light in a vertical direction.

26. The device of claim 6 further comprising:
    a pump input to the active region for pumping the active region above a lasing threshold for the laser cavity, whereby a gain of the active region is clamped to a gain value which is substantially independent of an amplitude of an optical signal propagating along an amplifying path within the active region; wherein the amplifying path is not colinear with an optical path of the laser cavity, and the optical signal is amplified by the gain value as it propagates along the amplifying path.

27. The device of claim 26 wherein:
    the first and second semiconductor layers comprise materials selected from an InP materials system; and
    the third semiconductor layer comprises materials selected from a GaAs materials system.

28. The device of claim 27 wherein the second semiconductor layer comprises:
    two sublayers, each sublayer comprising a different material selected from the InP materials system.

29. The device of claim 27 further comprising:
a current confinement structure located between the third semiconductor layer and the pump input for channeling a pump current injected at the pump input through the active region.

30. A monolithic optoelectronic semiconductor device extending along a vertical direction comprising;
a first semiconductor layer of a first doping type, wherein the first doping type is either n-type doping or p-type doping;
a second semiconductor layer of a second doping type, wherein the second doping type is either n-type doping or p-type doping, and the second doping type is different from the first doping type;
an active region located between the first and second semiconductor layers;
a third semiconductor layer of the second doping type, wherein the second and third semiconductor layers are in direct contact with each other, forming an interface between the second and third semiconductor layers, the interface characterized by trap-like defects; and
a concentration of dopants of the second doping type located in close proximity to the interface, wherein the concentration of dopants of the second doping type is in addition to bulk dopant concentrations in either the second semiconductor layer or the third semiconductor layer.

31. The device of claim 30 wherein the concentration of dopants comprises:
a delta doping layer of the second doping type located in close proximity to the interface.

32. The device of claim 30 further comprising:
a bottom mirror layer and a top mirror layer, wherein the bottom and top mirror layers form a laser cavity including the active region.

33. The device of claim 32 wherein the concentration of dopants comprises:
a delta doping layer of the second doping type located in close proximity to the interface between the second and third semiconductor layers.

34. The device of claim 32 wherein the second semiconductor layer comprises:
two sublayers with a contaminated interface therebetween.

35. The device of claim 32 wherein the first doping type is n-type doping.

36. The device of claim 32 wherein:
the first and second semiconductor layers comprise materials selected from a first materials system; and
the third semiconductor layer comprises materials selected from a second materials system.

37. The device of claim 36 wherein at least one of the materials systems is based on a III–V semiconductor compound.

38. The device of claim 32 wherein the laser cavity outputs laser light in a vertical direction.

39. The device of claim 32 further comprising:
a pump input to the active region for pumping the active region above a lasing threshold for the laser cavity, whereby a gain of the active region is clamped to a gain value which is substantially independent of an amplitude of an optical signal propagating along an amplifying path within the active region; wherein the amplifying path is not colinear with an optical path of the laser cavity, and the optical signal is amplified by the gain value as it propagates along the amplifying path.

* * * * *

UNITED STATES PATENT AND TRADEMARK OFFICE
CERTIFICATE OF CORRECTION

| | |
|---|---|
| PATENT NO. | : 6,647,041 B1 |
| APPLICATION NO. | : 09/580322 |
| DATED | : November 11, 2003 |
| INVENTOR(S) | : Verma et al. |

It is certified that error appears in the above-identified patent and that said Letters Patent is hereby corrected as shown below:

Title Page,
Item (56), under "OTHER PUBLICATIONS", Line 5, change "A1GaAs" to --AlGaAs--
Item (56), under "OTHER PUBLICATIONS", Line 9, change "A1GaAs" to --AlGaAs--

Column 1,
Line 14, change "09/09/416,817" to --09/416,817--

Column 5,
Line 55, change "p-InAllAs" to --p-InAlAs--

Column 6,
Line 17, before "alternating layers" change "and /or" to --and/or--

Column 11,
Lines 14-15, remove [either n-type doping or p-type doping;] and replace with the following sentence fragment:
    --selected from a group consisting of n-type doping and p-type doping;--
Lines 17-18, remove [either n-type doping or p-type doping,] and replace with the following sentence fragment:
    --selected from a group consisting of n-type doping and p-type doping,--
Line 24, remove [lattice mismatched and are]
Line 25, change "other forming" to --other and forming an--
Line 26, after "layers" insert --is lattice mismatched: and--
Line 28, before "interface" insert --lattice mismatched--
Line 37, before "interface." insert --lattice mismatched--
Line 58, before "interface." insert --lattice mismatched--

UNITED STATES PATENT AND TRADEMARK OFFICE
CERTIFICATE OF CORRECTION

PATENT NO. : 6,647,041 B1
APPLICATION NO. : 09/580322
DATED : November 11, 2003
INVENTOR(S) : Verma et al.

It is certified that error appears in the above-identified patent and that said Letters Patent is hereby corrected as shown below:

Column 13,
Lines 9-10, remove [either n-type doping or p-type doping;] and insert the following sentence fragment:
 --selected from a group consisting of n-type doping and p-type doping;--
Lines 12-13, remove [either n-type doping or p-type doping,] and insert the following sentence fragment:
 --selected from a group consisting of n-type doping and p-type doping,--
Line 19, remove [other, forming] and insert --other and--
Lines 20-21, remove [layers, the interface] and insert --layers is--

Signed and Sealed this

Twenty-fifth Day of March, 2008

JON W. DUDAS
*Director of the United States Patent and Trademark Office*